(12) United States Patent
Vocali et al.

(10) Patent No.: US 7,835,879 B2
(45) Date of Patent: Nov. 16, 2010

(54) METHOD AND DEVICE FOR CALIBRATING A MAGNETIC SENSOR

(75) Inventors: Francesco Vocali, Empoli (IT); Fabio Biganzoli, Jerago (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 91 days.

(21) Appl. No.: 12/196,513

(22) Filed: Aug. 22, 2008

(65) Prior Publication Data
US 2009/0070056 A1    Mar. 12, 2009

(30) Foreign Application Priority Data

Aug. 23, 2007    (EP) .................................. 07425537

(51) Int. Cl.
*G01C 17/38* (2006.01)
(52) U.S. Cl. .............................. 702/92; 702/93; 702/94; 33/356
(58) Field of Classification Search .................. 702/92, 702/93, 94; 33/356
See application file for complete search history.

(56) References Cited

U.S. PATENT DOCUMENTS

| | | | | |
|---|---|---|---|---|
| 5,117,375 | A | * | 5/1992 | Worcester et al. ............. 702/92 |
| 5,694,037 | A | * | 12/1997 | Palstra et al. ................ 324/202 |
| 6,543,146 | B2 | | 4/2003 | Smith et al. |
| 7,177,779 | B2 | | 2/2007 | Hikida et al. |
| 2002/0092188 | A1 | * | 7/2002 | Smith ........................... 33/356 |
| 2005/0049820 | A1 | * | 3/2005 | Kirsch et al. ................. 702/150 |
| 2005/0183275 | A1 | * | 8/2005 | Kwon et al. .................... 33/361 |
| 2005/0283988 | A1 | * | 12/2005 | Sato et al. ..................... 33/356 |
| 2007/0288166 | A1 | * | 12/2007 | Ockerse et al. .............. 701/224 |
| 2008/0091372 | A1 | * | 4/2008 | Sato et al. ..................... 702/92 |
| 2008/0270068 | A1 | | 10/2008 | Caritu et al. |

FOREIGN PATENT DOCUMENTS

| | | |
|---|---|---|
| EP | 1043566 A2 | 10/2000 |
| EP | 1698857 A1 | 9/2006 |

* cited by examiner

*Primary Examiner*—Drew A Dunn
*Assistant Examiner*—Manko Cheung
(74) *Attorney, Agent, or Firm*—Lisa K. Jorgenson; Robert Iannucci; Seed IP Law Group PLLC

(57) ABSTRACT

Measurements are acquired from a magnetic sensor during a non-pre-ordered movement, and a plurality of sets of solutions are determined for respective expected values of intensity of the Earth's magnetic field. The solutions are defined by a plurality of parameters, including at least one gain value for each detection axis of the magnetic sensor. For each solution, a figure of merit is determined, correlated to a calibration error, and a partial solution is selected in each set of solutions, based on the figure of merit. Once a gain confidence interval has been defined, a calibration solution is selected based on the figure of merit, from among the partial solutions having respective gain values all falling within the gain confidence interval.

32 Claims, 6 Drawing Sheets

METHOD AND DEVICE FOR CALIBRATING A MAGNETIC SENSOR

CROSS-REFERENCE TO RELATED APPLICATION

This application claims priority from and the benefit of the filing date of European Patent Application No. 07425537.3 filed Aug. 23, 2007, the content of which is hereby incorporated herein by reference in its entirety.

BACKGROUND

1. Technical Field

The present invention relates generally to calibration of magnetic sensors.

2. Description of the Related Art

It is known to use magnetic sensors for making devices designed to determine an orientation and/or a position of a body, such as, for example, compasses and navigation systems. Magnetic sensors can determine the orientation of their own detection axes with respect to the Earth's magnetic field, which defines a fixed reference with respect to the ground.

Prior to their use, magnetic sensors must be calibrated so as to eliminate or at least reduce any imprecision and disturbance that can derive from different sources, such as, for example, process dispersions during manufacture, magnetic interference caused by the circuitry that controls the magnetic sensor, interference due to external causes (loudspeakers, batteries, ferromagnetic elements), dependence upon temperature and time. Calibration generally consists in selecting an appropriate set of gain and offset values for each detection axis of the magnetometer.

The calibration methods currently used are as a rule carried out just once at the moment of manufacture or else at the moment of installation of the device in an apparatus in which it is to be used (for example, in the navigation system of an automobile). According to known calibration methods, a magnetometer is rotated through 360° in a horizontal plane so as to determine the direction of the magnetic North. In the case of triaxial sensors, in a second step the magnetic sensor is rotated also in a vertical plane passing through the magnetic North. The gain and offset values are then modified until a response of the magnetic sensor is obtained (in particular minimum and maximum values of intensity) in line with a magnetic field value expected in the point where the calibration is carried out. The methods of this type, however, present the disadvantage of not being repeatable after installation of the magnetic sensor because it is necessary to restore well-defined environmental conditions and carry out accurate rotations of the magnetic sensor according to degrees of freedom that are often no longer available. Furthermore, calibration as described necessarily requires the comparison with a value of magnetic field supplied by an already calibrated reference, which is not easily available. Consequently, albeit precise and accurate they may be, known calibration methods are not useful for compensating for the effects of sources of disturbance and error that intervene after the magnetic sensor has been set in operation.

Other known methods are based on statistical processing of sets of measurements made during a random movement of the magnetic sensor. In practice, the average of the measurements according to each detection axis is estimated and used as indication of the offset values of the magnetic sensor. In this case, the method is irrespective of the availability of a previously calibrated reference, but does not enable calibration of the gain values.

BRIEF SUMMARY

Disclosed herein is a method of calibration of a magnetic sensor that may enable at least some of the limitations described to be overcome and, in particular, may enable calibration to be carried out also after installation of the magnetic sensor in a user device.

In one embodiment, a method is disclosed. The method may comprise calibrating a magnetic sensor, the calibrating including: acquiring measurements from a magnetic sensor during a not pre-ordered movement; determining a plurality of sets of solutions for respective expected values of intensity of Earth's magnetic field, wherein each solution is defined by a plurality of parameters including at least one gain value for each detection axis of the magnetic sensor; determining a figure of merit, correlated to a calibration error, for each solution in the sets of solutions; selecting partial solutions in the sets of solutions, respectively, based on the figure of merit; defining a gain confidence interval; and selecting a calibration solution based on the figure of merit, from among the partial solutions having respective gain values all falling within the gain confidence interval. In another embodiment, a device for calibrating a magnetic sensor is disclosed. The device may comprise an acquisition module, an optimization module, and a selection module. The acquisition module is configured to acquire measurements from a magnetic sensor during a non-pre-ordered movement. The optimization module is configured to: determine a plurality of sets of solutions for respective expected values of intensity of Earth's magnetic field, wherein each solution is defined by a plurality of parameters including at least one gain value for each detection axis of the magnetic sensor; determine a figure of merit, correlated to a calibration error, for each solution in the sets of solutions; and select partial solutions in the sets of solutions, respectively, based on the figure of merit. The selection module is configured to define a gain confidence interval and select a calibration solution based on the figure of merit, from among the partial solutions having respective gain values all falling within the gain confidence interval.

In yet another embodiment, an electronic apparatus is disclosed. The electronic apparatus may comprise a body, a magnetic sensor fixed to the body, and a device for calibrating the magnetic sensor. The device may include an acquisition module, an optimization module, and a selection module. The acquisition module is configured to acquire measurements from the magnetic sensor during a non-pre-ordered movement. The optimization module is configured to: determine a plurality of sets of solutions for respective expected values of intensity of Earth's magnetic field, wherein each solution is defined by a plurality of parameters including at least one gain value for each detection axis of the magnetic sensor; determine a figure of merit, correlated to a calibration error, for each solution in the sets of solutions; and select partial solutions in the sets of solutions, respectively, based on the figure of merit. The selection module is configured to define a gain confidence interval and select a calibration solution based on the figure of merit, from among the partial solutions having respective gain values all falling within the gain confidence interval.

In still another embodiment, a navigation system is disclosed. The navigation system may comprise a magnetic sensor configured to generate measurements indicative of a magnetic field and a processing unit coupled to the magnetic sensor. The processing unit may be operable to calibrate the magnetic sensor by: acquiring the measurements from the magnetic sensor during movement of the magnetic sensor; determining a plurality of sets of solutions for respective expected values of intensity of Earth's magnetic field, wherein each solution is defined by a plurality of parameters including at least one gain value for each detection axis of the magnetic sensor; determining a figure of merit, correlated to a calibration error, for each solution in the sets of solutions; selecting partial solutions in the sets of solutions, based on the figure of merit; defining a gain confidence interval; and selecting a calibration solution based on the figure of merit, from among the partial solutions having respective gain values all falling within the gain confidence interval.

BRIEF DESCRIPTION OF THE SEVERAL VIEWS OF THE DRAWINGS

One embodiment of the invention is now described, purely by way of non-limiting example and with reference to the attached drawings, wherein.

DETAILED DESCRIPTION

In the following description, reference will be made to use of a magnetic sensor or magnetometer in a pointing and control device for a computer system, without this being considered as in any way limiting the scope of the invention. At least some embodiments can be in fact exploited for calibration of any magnetic sensor, for use in a variety of applications, such as, for example, compasses or navigation systems.

Figure 1:
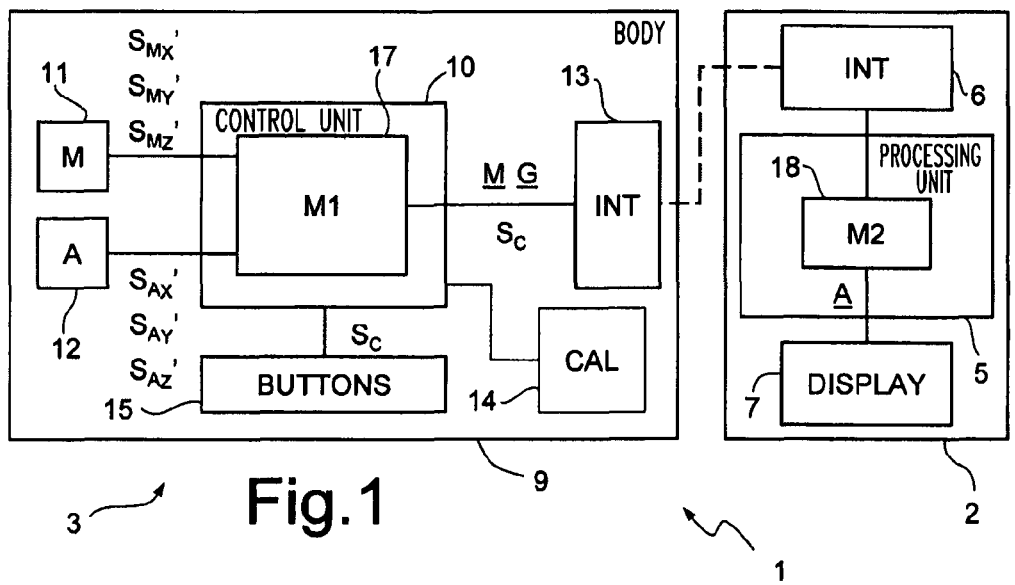
FIG. 1 is a simplified block diagram of a computer system provided with a magnetic sensor and a device for calibration of the magnetic sensor that implements a calibration method in accordance with one embodiment of the present invention.

With reference to FIG. 1, a computer system, designated as a whole by the number 1, comprises a computer 2 and a pointing and control device 3.

The computer 2 is equipped with a processing unit 5 and further comprises a communication interface 6 and a display 7.

The pointing and control device 3 comprises a body 9 shaped so as to be maneuverable by a user. Inside the body 9, the pointing and control device 3 further comprises a control unit 10, for example a microcontroller or a DSP (Digital Signal Processor), a magnetometer 11, an inertial sensor, in particular an accelerometer 12, a calibration unit 14, and a further communication interface 13, for communicably coupling with the communication interface 6 of the computer 2. Control buttons 15 are carried on the body 9 and are communicably coupled with the control unit 10 inside the body 9.

The pointing and control device 3 further comprises a first processing module 17 and a second processing module 18, which, in the embodiment described herein, reside, respectively, in the control unit 10 and in the processing unit 5.

Figure 2:
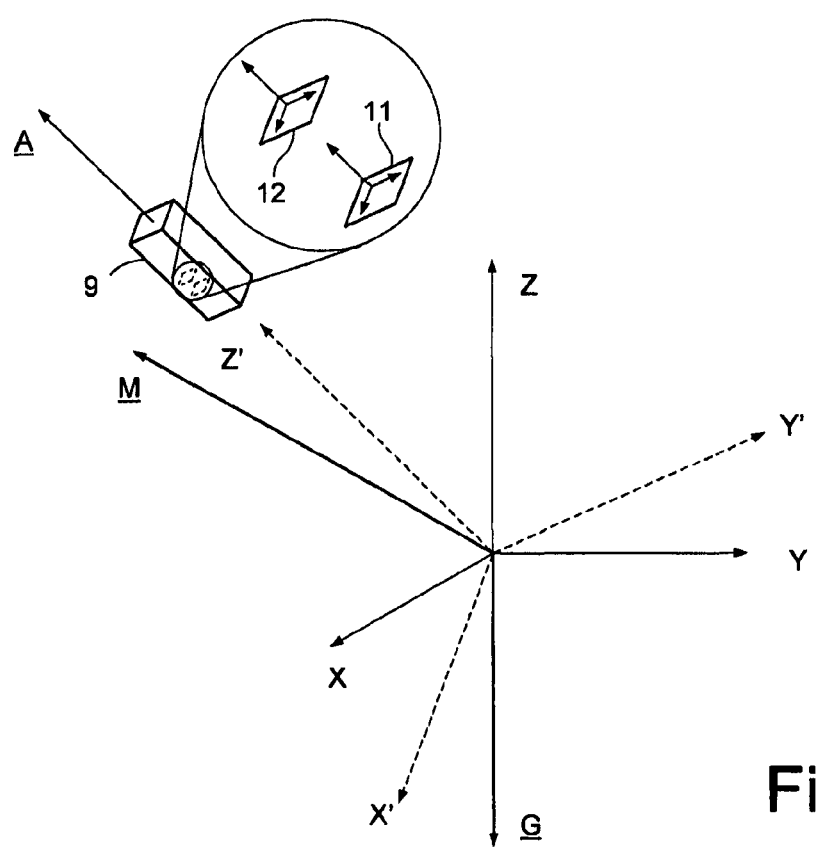
FIG. 2 is a graph that shows an absolute reference system and a relative reference system used by a pointing and control device of FIG. 1.

The magnetometer 11 and the accelerometer 12 are of the MEMS (Micro-Electro-Mechanical Systems) type and both have three independent and mutually perpendicular detection axes. The magnetometer 11 and the accelerometer 12 are moreover arranged so as to provide measurements corresponding to the same relative reference system X', Y', Z' with axes parallel to respective detection axes of the magnetometer 11 and of the accelerometer 12, as shown in FIG. 2 (in practice, the magnetometer 11 and the accelerometer 12 each have a first detection axis, a second detection axis, and a third detection axis, parallel to respective co-ordinate axes of the relative reference system X', Y', Z').

The magnetometer 11, in particular, responds to static magnetic fields and generates magnetic-field signals $S_{MX}'$, $S_{MY}'$, $S_{MZ}'$ indicating magnetic-field components according to respective axes of the relative reference system X', Y', Z'.

The accelerometer 12 generates acceleration signals $S_{AX}'$, $S_{AY}'$, $S_{AZ}'$ indicating accelerations to which the accelerometer 12 itself is subjected. In addition, the acceleration signals $S_{AX}'$, $S_{AY}'$, $S_{AZ}'$ are determined also by the orientation of the accelerometer 12 with respect to the direction of the Earth's gravitational field.

The control unit 10 receives the magnetic-field signals $S_{MX}'$, $S_{MY}'$, $S_{MZ}'$ and the acceleration signals $S_{AX}'$, $S_{AY}'$, $S_{AZ}'$, which are processed in the first processing module 17 as described hereinafter, for determining a magnetic-field vector M and a gravitational-field vector G, indicating the direction and intensity of the Earth's magnetic field and gravitational field, respectively.

The second processing module 18, that resides in the processing unit 5, receives the magnetic-field vector M, the gravitational-field vector G, and the control signals $S_C$ through the communication interface 6. The magnetic-field vector M and the gravitational-field vector G are used for determining an absolute reference system XYZ fixed with respect to the ground and an orientation of the body 9 of the pointing and control device 3 in the absolute reference system XYZ, by transformations of co-ordinates.

The orientation of the pointing and control device 3 thus determined is used for controlling a flow of operations carried out by the computer 2. The first processing module 17 carries out a filtering for reduction of the noise and extracts the d.c. components of the acceleration signals $S_{AX}'$, $S_{AY}'$, $S_{AZ}'$, which define respective relative components of gravitational field $G_{X'}$, $G_{Y'}$, $G_{Z'}$ of the gravitational-field vector G (in the relative reference system X'Y'Z').

Figure 3:
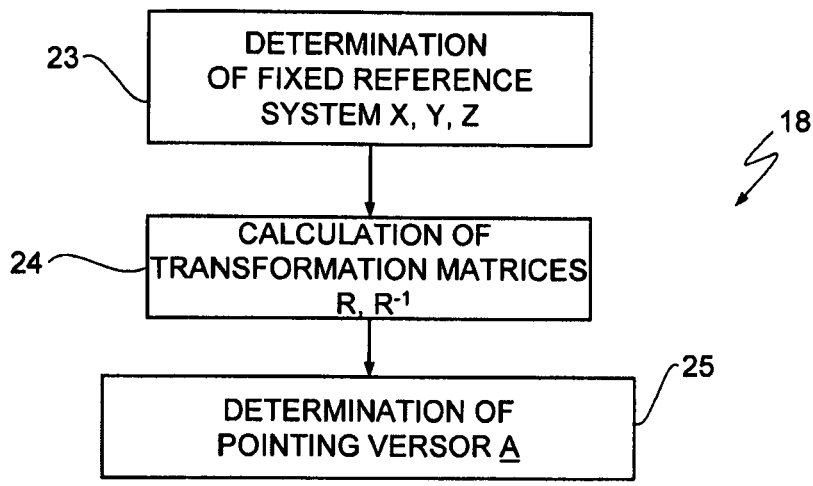
FIG. 3 is a flowchart regarding operation of the computer system of FIG. 1.

As is shown in FIG. 3, the second processing module 18 comprises a first calculation stage 23, a second calculation stage 24, and a third calculation stage 25, cascade connected.

Figure 4A:
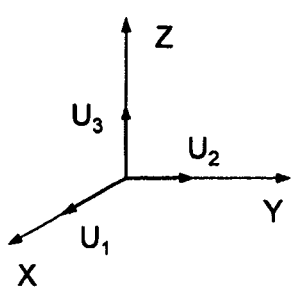
FIG. 4a is a graph that illustrates in greater detail the absolute reference system of FIG. 2.

In detail, the first calculation stage 23 determines the absolute reference system X, Y, Z starting from the magnetic-field vector M and from the gravitational-field vector G, which are linearly independent. More precisely, the relative co-ordinates (i.e., with respect to the relative reference system X'Y'Z') of three first versors $U_1$, $U_2$, $U_3$ are calculated, said versors being mutually perpendicular and each being parallel to a respective axis of the absolute reference system X, Y, Z (FIGS. 2 and 4a). The calculation is based upon the relative magnetic-field components $M_X'$, $M_Y'$, $M_Z'$ of the magnetic-field vector and upon the relative components of gravitational field $G_X'$, $G_Y'$, $G_Z'$ of the gravitational-field vector G and upon the following equations:

$$U_1 = \frac{-G}{\|-G\|} = [U_{11} \quad U_{12} \quad U_{13}]^T$$

$$U_2 = \frac{-G \wedge M}{\|-G \wedge M\|} = [U_{21} \quad U_{22} \quad U_{23}]^T$$

$$U_3 = \frac{-G \wedge (-G \wedge M)}{\|-G \wedge (-G \wedge M)\|} = [U_{31} \quad U_{32} \quad U_{33}]^T$$

where $$\underline{M} = [M_X' \quad M_Y' \quad M_Z']^T$$

$$\underline{G} = [G_X' \quad G_Y' \quad G_Z']^T$$

Using the first versors $U_1$, $U_2$, $U_3$, the second calculation stage 24 defines a first transformation matrix R as follows:

$$R = [U_1 \quad U_2 \quad U_3] = \begin{bmatrix} U_{11} & U_{21} & U_{31} \\ U_{12} & U_{22} & U_{32} \\ U_{13} & U_{23} & U_{33} \end{bmatrix}$$

The second calculation stage 24 calculates also a second transformation matrix $R^{-1}$, which is the inverse of the transformation matrix R and enables transformation of co-ordinates from the relative reference system X', Y', Z' to the absolute reference system X, Y, Z.

The third calculation stage 25 determines the orientation of the relative reference system X', Y', Z' in the absolute reference system X, Y, Z, fixed with respect to the ground. In particular, the third calculation stage 25 determines the direction, in the absolute reference system X, Y, Z, of a pointing versor A (FIG. 2), which is fixed with respect to the body 9 and has a pre-determined and known direction in the relative reference system X', Y', Z'. In the embodiment described herein, the pointing versor A is directed as the versor $V_3'$ (axis Z') but could have any direction. In greater detail, the third calculation stage 25 uses the second transformation matrix $R^{-1}$ for calculating the direction of the pointing versor A according to the relation $$A = R^{-1} A'$$

where A' indicates the direction of the pointing versor in the reference system X', Y', Z'.

Figure 4B:
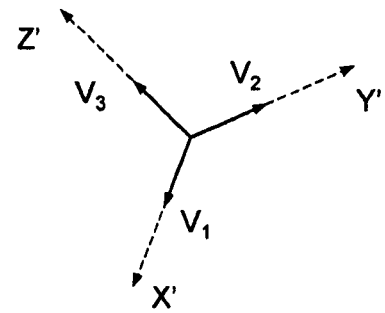
FIG. 4b is a graph that illustrates in greater detail the relative reference system of FIG. 2.

Furthermore, the third calculation stage 25 determines absolute co-ordinates of three second versors $V_1$, $V_2$, $V_3$, each of which is parallel to a respective axis of the relative reference system X', Y', Z', as shown in FIG. 4b (the direction of the second versors $V_1$, $V_2$, $V_3$ in the relative reference system X', Y', Z' is hence known). The transformation made by the third calculation stage 25 is the following:

$$V_1 = R^{-1} V_1'$$

$$V_2 = R^{-1} V_2'$$

$$V_3 = R^{-1} V_3'$$

where $V_1'$, $V_2'$, $V_3'$ are the co-ordinates of the second versors $V_1$, $V_2$, $V_3$ in the relative reference system X', Y', Z'.

The orientation of the body 9 in the absolute reference system X, Y, Z is thus completely determined.

Figure 5:
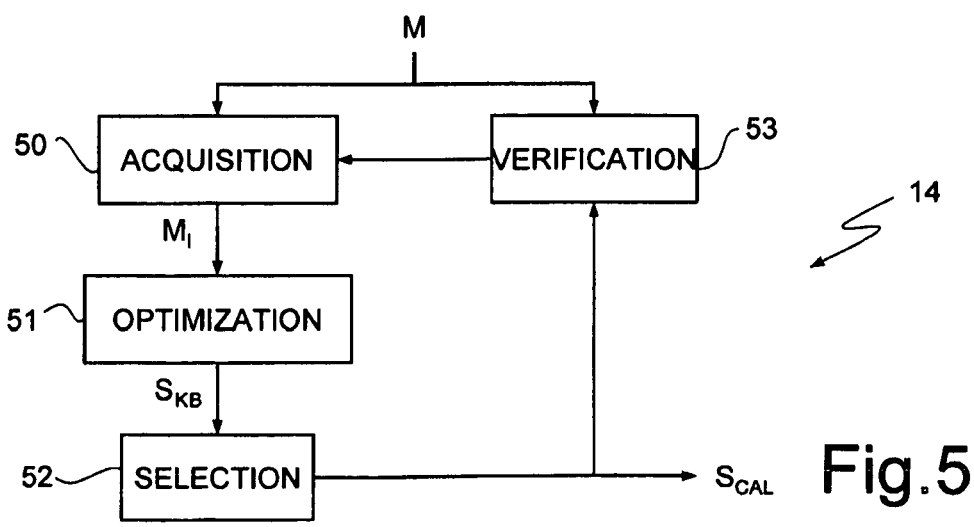
FIG. 5 is a more detailed block diagram of the calibration device of FIG. 1.

Calibration of the magnetometer 11 is carried out by the calibration unit 14, which comprises an acquisition module 50, an optimization module 51, a selection module 52 and a verification module 53, as shown in FIG. 5.

Figure 6:
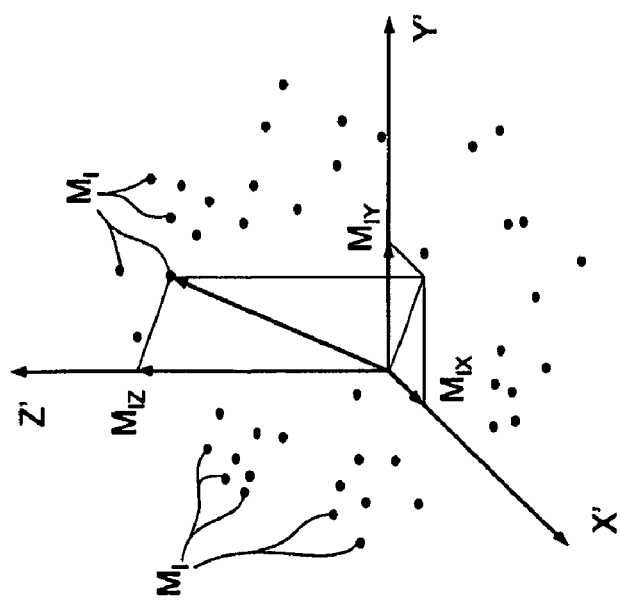
FIG. 6 is a graph that illustrates quantities regarding the method according to one embodiment of the present invention.

Initially, the acquisition module 50 acquires and stores a series of measurements $M_I$ of the magnetic-field vector M supplied by the magnetometer 11 during random movements of the latter (see also FIG. 6). Acquisition of the measurements is carried out during a dedicated step of the calibration procedure, in which a user is invited to move the control and pointing device 3 randomly, or else during normal operation, in a way transparent to the user. The measurements $M_I$ are defined by sets of three values obtained from the magnetic-field signals $S_{MX}'$, $S_{MY}'$, $S_{MZ}'$. In principle, the measurements $M_I$ have the same physical meaning as the relative magnetic-field components $M_X'$, $M_Y'$, $M_Z'$. However, they do not correspond exactly, because the calibration has not yet been completed. For convenience, in FIG. 6 the measurements $M_I$ are represented as points of co-ordinates $M_{IX}$, $M_{IY}$, $M_{IZ}$, which correspond to the components measured along the detection axes of the magnetometer 11 (i.e., according to the axes of the relative reference system X', Y', Z'). The measurements are acquired so as to prevent clustering exclusively in restricted regions, as explained hereinafter.

Next, the optimization module 51 generates sets of calibration solutions (or, more simply, solutions, as they will be referred to hereinafter for reasons of convenience) $S_K$ for a pre-determined number $N_H$ of admissible expected values $H_K$ of local intensity of the Earth's magnetic field, starting from previously acquired measurements. A solution $S_K$ is defined by a set of three gain values $GM_X$, $GM_Y$, $GM_Z$ and by a set of three offset values $OM_X$, $OM_Y$, $OM_Z$, which must be applied for correcting the values supplied by the magnetometer 11 along respective detection axes (a respective gain value and a respective offset value correspond to each detection axis).

Furthermore, the optimization module 51 determines, in each set of solutions $S_K$ generated, an optimal solution $S_{KB}$ for each expected value $H_K$. The optimal solution $S_{KB}$ is such that a figure of merit, which is a function of the corresponding expected value $H_K$, is minimum. The number of optimal solutions $S_{KB}$ is equal to the number $N_H$ of admissible expected values $H_K$.

Finally, the selection module 52 selects a calibration solution $S_{CAL}$ between the optimal solutions $S_{KB}$ corresponding to each expected value $H_K$. The selection is carried out in such a way that the measurements supplied by the magnetometer 11, once the calibration solution $S_{CAL}$ has been applied, will correspond to the value of the Earth's magnetic field actually present in the region in which the magnetometer 11 is used (more precisely, to an approximating value $H_E$ that most nearly approaches the effective value of the Earth's magnetic field amongst the admissible expected values $H_K$).

The verification module 53 is configured for automatically requesting activation of the calibration procedure when the magnetic field value measured by the magnetometer varies on account of magnetic interference (for example, because the device has been brought up to a source of magnetic interference, such as cell phones, monitors, large metal objects, etc.) or else when the effective value of the Earth's magnetic field varies (for example, because the pointing and control device 3 that incorporates the magnetometer 11 has been carried into a different place), and hence the approximating value $H_E$ and the calibration solution $S_{CAL}$ are no longer adequate to guarantee the necessary precision. In particular, the verification module 53 acquires and stores series of measurements $M_I'$ of the magnetic-field vector M during normal operation of the pointing and control device 3, applies the calibration solution $S_{CAL}$ to the measurements $M_I'$ stored and, as described later on, carries out a safety measurement. Specifically, in the embodiment herein described, the verification module 53 generates a calibration-request signal CR, by which the acquisition module 50 is activated. In an alternative embodiment, a different safety measurement is performed. For example, a warning message is generated for the user, who decides whether to activate the calibration procedure manually.

Figure 7:
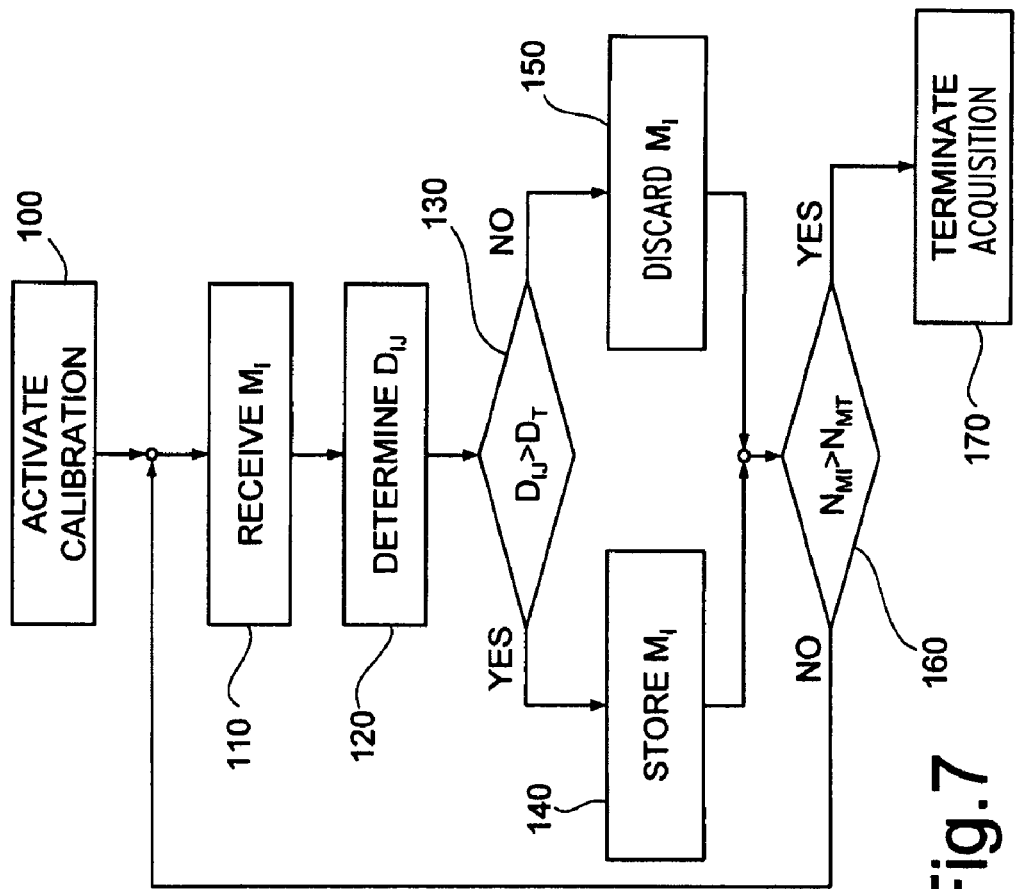
FIG. 7 is a simplified flowchart regarding a first procedure used in the method according to one embodiment of the invention.

The procedure for acquisition of measurements $P_I$, carried out by the acquisition module 50, will be described hereinafter with reference to FIG. 7.

Once the acquisition procedure is activated (block 100), the acquisition module 50 receives a series of measurements $M_I$, obtained on the basis of the magnetic-field signals $S_{MX}'$, $S_{MY}'$, $S_{MZ}'$ of the magnetometer 11, while it is randomly moved in space (block 110). For each new measurement $M_I$ detected, the calibration unit determines distances $D_{IJ}$ with respect to all the measurements $M_J$ previously stored (block 120). The distance $D_{IJ}$ is defined as $$D_{IJ} = \sqrt{(M_{IX} - M_{JX})^2 + (M_{IY} - M_{JY})^2 + (M_{IZ} - M_{JZ})^2} \quad (1)$$

If all the distances $D_{IJ}$ calculated are greater than a threshold distance $D_T$ (block 130, output YES), the new measurement $M_I$ is stored (block 140); otherwise (block 130, output NO), it is discarded (block 150).

Then, the number $N_{MI}$ of measurements $M_I$ stored is compared with a threshold number of measurements $N_{MT}$ (block 160). If the threshold number of measurements $N_{MT}$ has been reached, the acquisition procedure terminates (block 160, output YES; block 170). Possibly, the calibration unit 14 communicates to the user that the movement of the magnetometer 11 can be interrupted. Otherwise (block 160, output NO), the acquisition module 50 receives and processes a further new measurement $M_I$ (block 110).

Figure 8:
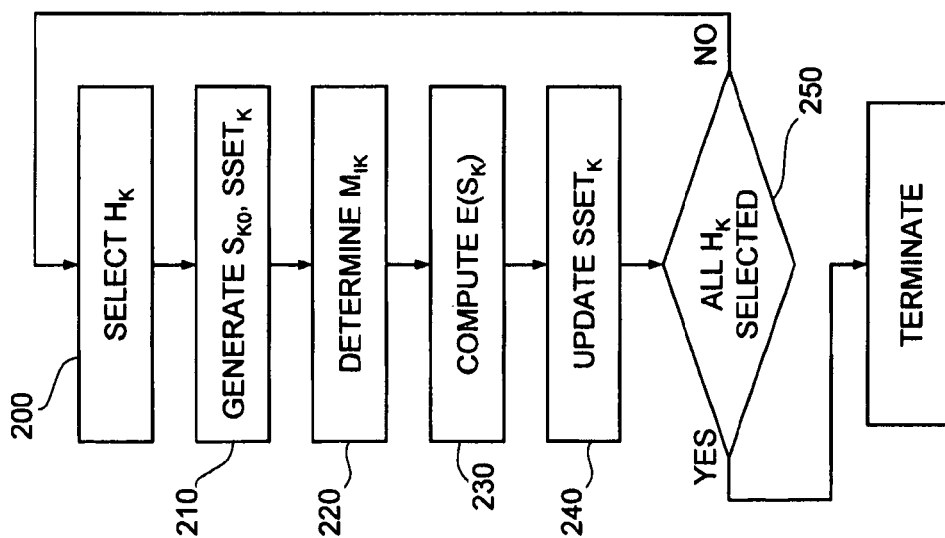
FIG. 8 is a simplified flowchart regarding a second procedure used in the method according to one embodiment of the invention.

FIG. 8 illustrates the operation of the optimization module 51, which uses an iterative procedure to generate the solutions $S_K$ for different expected values $H_K$ of the Earth's magnetic field. In greater detail, the optimization module 51 selects an expected value $H_K$ among the possible expected values (block 200, initially with K=1) and generates a number $N_S$ of starting solutions $S_{K0}$, starting from the measurements $M_I$ acquired (block 210; for example, $N_S$ is comprised between 1 and 10). The $N_S$ starting solutions $S_{K0}$ initially define a set of solutions $SSET_K$ for the selected expected value $H_K$.

In particular, in the embodiment described, the initial gain values $GM_{0X}$, $GM_{0Y}$, $GM_{0Z}$ of each starting solution $S_{K0}$ are determined around the unit value by summing a value of gain dispersion GS randomly selected in an interval of values $$GM_{0X} = GM_{0Y} = GM_{0Z} = 1 + GS \quad (2)$$

Likewise, initial offset values $OM_{0X}$, $OM_{0Y}$, $OM_{0Z}$ of each starting solution $S_0$ are determined by randomly selecting an offset dispersion value OS in an interval of values around the value zero $$OM_{0X} = OM_{0Y} = OM_{0Z} = OS \quad (3)$$

The solutions $S_K$ in the set of solutions $SSET_K$ (initially, the starting solutions $S_{K0}$) are then applied to the measurements $M_I$ for determining corrected measurements $M_{IK}$, as follows (block 220):

$$M_{IK} = \sqrt{(GM_X(M_{IX} - OM_X))^2 + (GM_Y(M_{IY} - OM_Y))^2 + (GM_Z(M_{IZ} - OM_Z))^2} \quad (4)$$

Next (block 230), the optimization module 51 calculates a value of a figure of merit $E(S_K)$ for each solution $S_K$ in the set of solutions $SSET_K$ (initially, the starting solutions $S_{K0}$). The figure of merit $E(S_K)$ indicates the calibration error committed using a given solution $S_K$ with respect to the expected value $H_K$ and is defined as $$E(S_K) = \epsilon_{IK}, I = 1, 2, \ldots, N_{MT} \quad (5)$$

where $$\epsilon_{IK} = |M_{IK} - H_K| \quad (6)$$

is the error between the corrected measurement $M_{IK}$ and the expected value $H_K$ of the Earth's magnetic field.

Next (block 240), the optimization module 51 repeats iteratively, for a number of iterations $N_I$, steps of updating the set of solutions $SSET_K$, which envisage generation of a new solution and inclusion or exclusion of the new solution, based on comparing the figure of merit of the new solution and the figure of merit of the solutions previously in the set of solutions $SSET_K$.

When all the expected values $H_K$ have been selected, the procedure terminates (block 250, output YES; block 260). Otherwise (block 250, output NO), a new expected value $H_K$ is selected (block 200).

Figure 9:
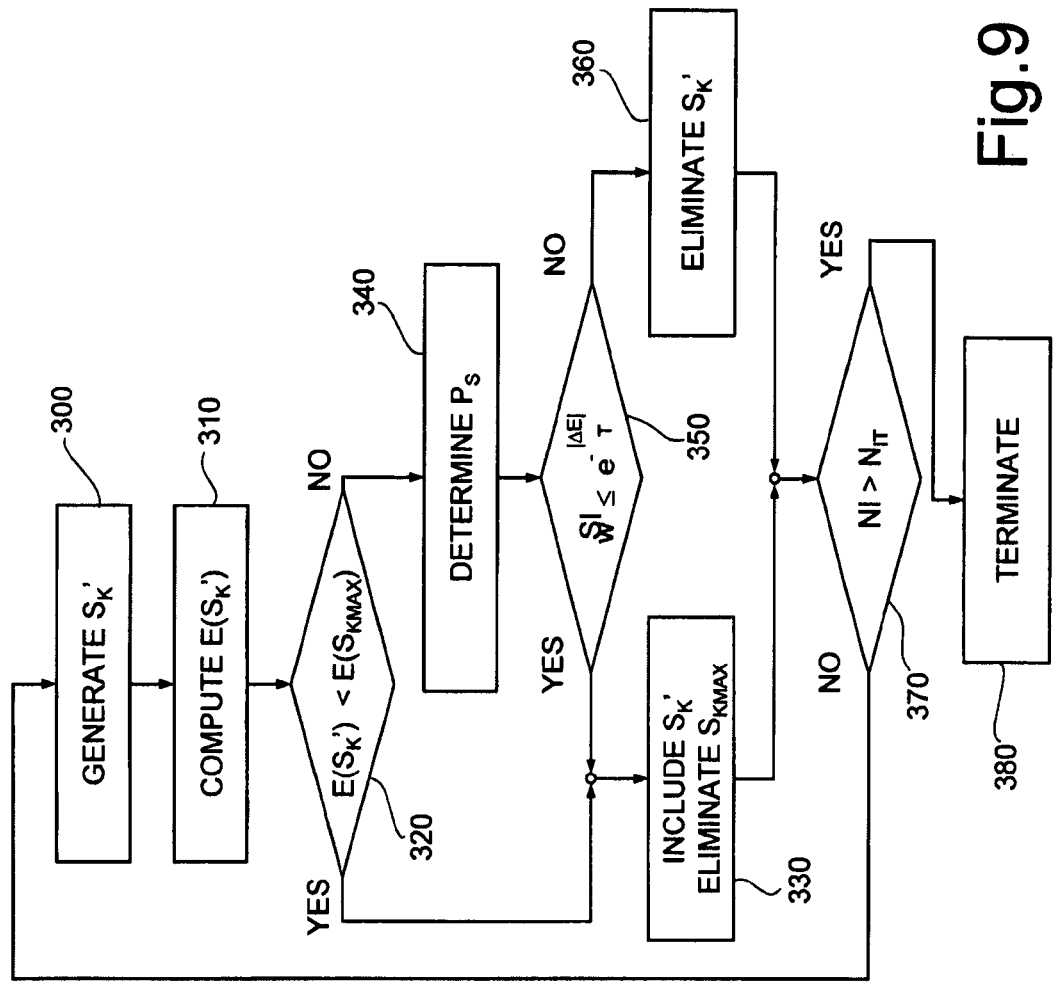
FIG. 9 is a more detailed flowchart regarding a step of the procedure of FIG. 8.
Figure 10:
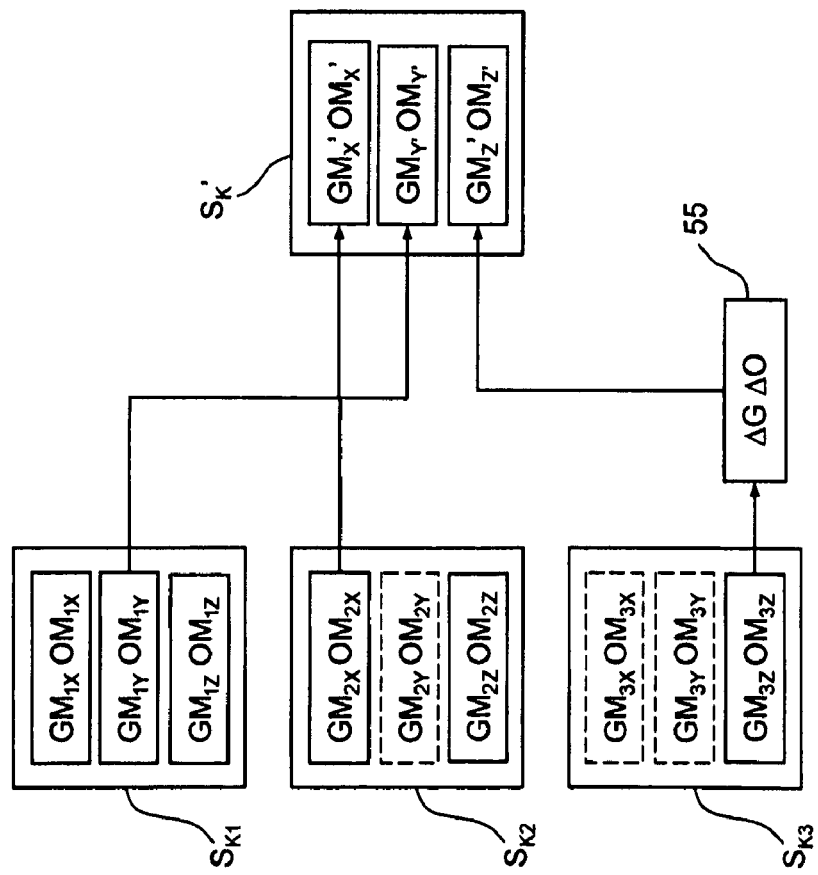
FIG. 10 is a simplified block diagram that illustrates elements used in the method according to one embodiment of the invention.

In greater detail, updating of the set of solutions $SSET_K$ is carried out as described hereinafter, with reference to FIG. 9. The optimization module 51 generates a new solution $S_K'$ starting from combinations of solutions $S_K$ in the set of solutions $SSET_K$ (block 300). In the embodiment described herein, in particular, the new solution $S_K'$ is determined on the basis of the three solutions of the set of solutions $SSET_K$ that have lowest figure of merit $E(S_K)$ and that will now be indicated, in order, as first, second, and third preferred solutions $S_{K1}$, $S_{K2}$, and $S_{K3}$, $S_{K1}$ being the solution with minimum figure of merit (see also FIG. 10). In what follows, reference will also be made to a least preferred solution $S_{KMAX}$ among those present in the set of solutions $SSET_K$, which has the highest figure of merit $E(S_{KMAX})$. One of the gain values $GM_{1X}$, $GM_{1Y}$, $GM_{1Z}$ and one of the offset values $OM_{1X}$, $OM_{1Y}$, $OM_{1Z}$ of the first preferred solution $S_{K1}$ are initially selected. In the embodiment described here, the selected values correspond to a same detection axis of the magnetometer 11. The optimization module 51 carries out the selection randomly and assigns the selected values to the new solution $S_K'$. In one example, values $GM_{1Y}$, $OM_{1Y}$ are selected corresponding to a detection axis parallel to the axis Y' of the relative reference system X', Y', Z' ($GM_{Y'} = GM_{1Y}$, $OM_{Y'} = OM_{1Y}$). Then, the optimization module 51 selects, once again randomly, a gain value $GM_{2X}$, $GM_{2Y}$, $GM_{2Z}$ and an offset value $OM_{2X}$, $OM_{2Y}$, $OM_{2Z}$ of the second preferred solution $S_{K2}$. The selected values correspond to a same detection axis of the magnetometer 11 different from the previous one, which is excluded. In the example, values $GM_{2X}$, $OM_{2X}$ are selected, corresponding to the detection axis parallel to the axis X' of the relative reference system X', Y', Z'. The selected values are assigned to the new solution $S_K'$. Finally, the optimization module 51 extracts from the third preferred solution $S_{K3}$ the gain value $GM_{3X}$, $GM_{3Y}$, $GM_{3Z}$ and the offset value $OM_{3X}$, $OM_{3Y}$, $OM_{3Z}$ corresponding to the remaining detection axis, modifies them with an additive gain contribution $\Delta G$ and an additive offset contribution $\Delta O$ and assigns them to the new solution $S_K'$ (modification module 55 of FIG. 10). In greater detail, the gain contribution $\Delta G$ and the offset contribution $\Delta O$ have an absolute value lower than a threshold gain contribution $\Delta G_T$ and to a threshold offset contribution $\Delta O_T$, respectively, and are randomly determined in the intervals:

$$-|\Delta G_T| < \Delta G < |\Delta G_T| \quad (7a)$$

$$-|\Delta O_T| < \Delta O < |\Delta O_T| \quad (7b)$$

Consequently, in the example described we have $$GM_{Z'} = GM_{Z3} + \Delta G \quad (8a)$$

$$OM_{Z'} = OM_{Z3} + \Delta O \quad (8b)$$

Once the new solution $S_K'$ has been determined, the optimization module 51 calculates the figure of merit $E(S_K')$ thereof (block 310) and compares it with the figure of merit $E(S_{KMAX})$ of the least preferred solution $S_{KMAX}$ (block 320). If the figure of merit $E(S_K')$ of the new solution $S_K'$ is lower than the figure of merit $E(S_{KMAX})$ of the least preferred solution $S_{KMAX}$ (block 320, output YES), the new solution $S_K'$ is included in the set of solutions $SSET_K$, while the least preferred solution $S_{KMAX}$ is eliminated (block 330).

If the figure of merit $E(S_K')$ of the new solution $S_K'$ is greater than the figure of merit $E(S_{KMAX})$ of the least preferred solution $S_{KMAX}$ (block 320, output NO), the inclusion or exclusion of the new solution $S_K'$ is determined on the basis of a replacement probability $P_S$, which is calculated as follows (block 340):

$$P_S = P\{w(e^{-\frac{|\Delta E|}{T}})\} \quad (9a)$$

$$\Delta E = E(S_K') - E(S_{KMAX}) \quad (9b)$$

where w is a random variable with uniform probability density comprised between 0 and 1 and T is a parameter that decreases as the number of iterations performed increases. If an extraction of the random variable w yields a value lower than $$e^{-\frac{|\Delta E|}{T}}$$

(block 350, output YES), the new solution $S_K'$ is included in the set of solutions $SSET_K$, while the least preferred solution $S_{KMAX}$ is eliminated (block 330). Otherwise (block 350, output NO), the new solution $S_K'$ is eliminated and the least preferred solution $S_{KMAX}$ is maintained (block 360).

If the steps of generation and selection of new solutions has been carried out for a number of iterations $N_I$ higher than a threshold number of iterations $N_{IT}$ (block 370, output YES), the optimization procedure terminates (block 380); otherwise, a further new solution $S_K'$ is generated (block 370, output NO; block 300).

At this point, the calibration unit 14 has produced a partial optimal solution $S_{KB}$ for each expected value $H_K$ of intensity of the Earth's magnetic field, i.e., the solution that has minimum figure of merit $E(S_{KB})$ in the respective set of solutions $SSET_K$.

Figure 11:
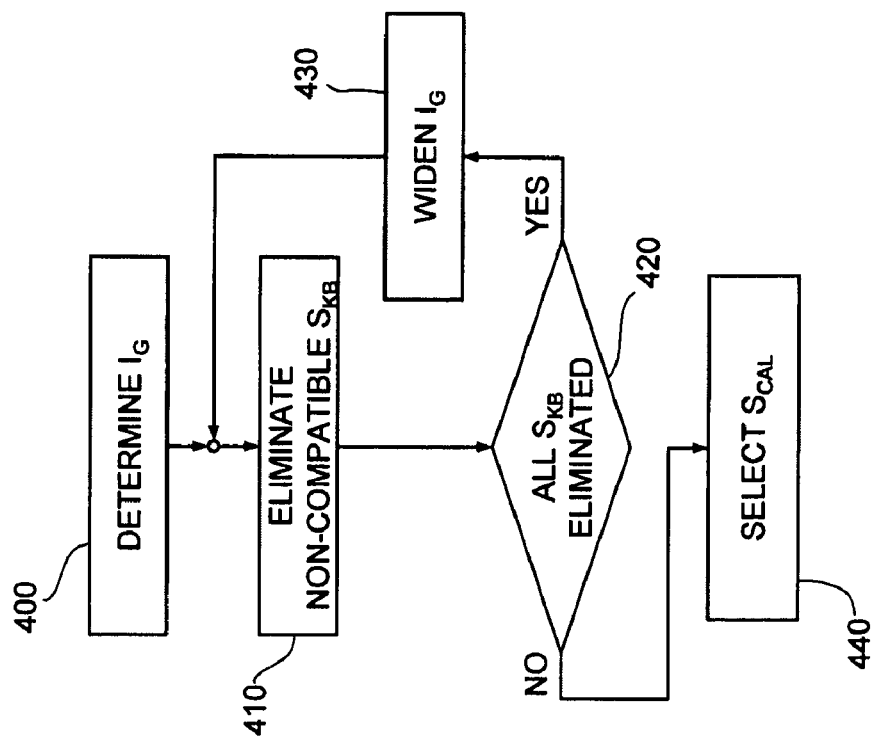
FIG. 11 is a simplified flowchart regarding a third procedure used in the method according to one embodiment of the invention.

The selection module 52 has the task of identifying the calibration solution SCAL among the partial optimal solutions $S_{KB}$ determined by the optimization module 51. With reference to FIG. 11, the selection module 52 fixes a threshold gain value $G_T$ and determines a gain confidence interval $I_G$ centered around the unit gain value (block 400), given by $$I_G = [1 - G_T, 1 + G_T] \quad (10)$$

In an alternative embodiment, the gain confidence interval $I_G$ is given by $$I_G = [1/G_T, G_T] \quad (11)$$

In an alternative embodiment, the gain confidence interval $I_G$ can be asymmetrical with respect to the unit value.

Next, the non-compatible partial optimal solutions $S_{KB}$, which have at least one gain value $GM_X$, $GM_Y$, $GM_Z$ falling outside the gain confidence interval $I_G$ are eliminated (block 410).

If all the partial optimal solutions $S_{KB}$ have been eliminated (block 420, output YES), a new gain confidence interval $I_G$, wider than the previous one, is determined by fixing a higher threshold gain value $G_T$ (block 430); then, elimination of the non-compatible partial optimal solutions $S_{KB}$ is repeated (block 410).

If at least some of the partial optimal solutions $S_{KB}$ have been maintained (block 420, output NO), among the remaining partial optimal solutions $S_{KB}$ the one having the minimum figure of merit $E(S_{KB})$ is selected and supplied as calibration solution $S_{CAL}$ (block 440).

In this way, in practice, the calibration solution $S_{CAL}$, which, applied to the measurements $M_{IK}$, produces on average the smallest error $\epsilon_{IK}$, is identified. Furthermore, the calibration method described does not require a magnetic-field calibrated reference because the solutions that do not correspond to the most probable expected value are eliminated.

The method can be then advantageously used in any moment of the life of the magnetometer and of the device in which the magnetometer is used. In particular, the calibration can be carried out in the conditions of use and is substantially immune from external disturbance, for example due to batteries, loudspeakers, inductances, transformers and ferromagnetic elements.

Figure 12:
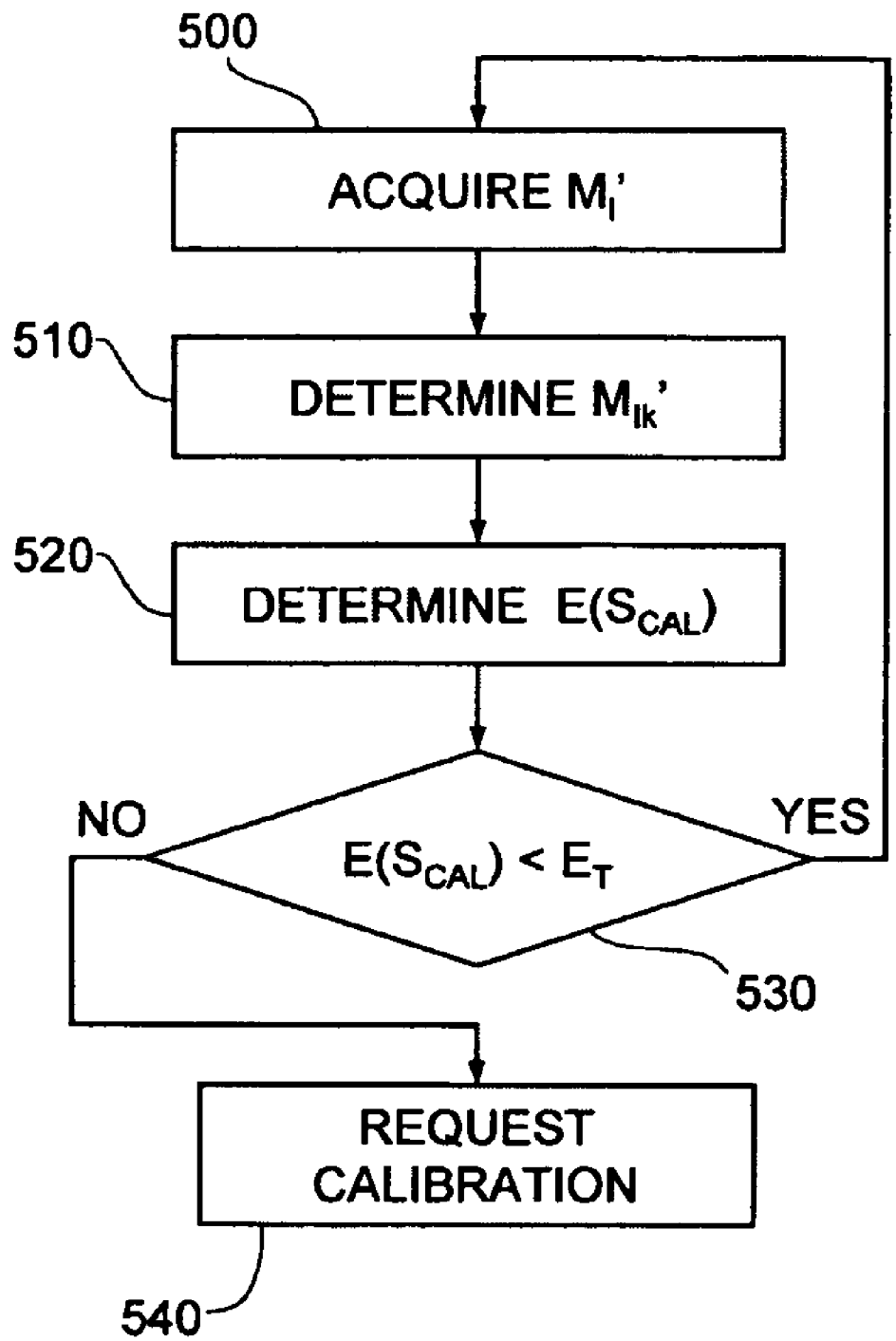
FIG. 12 is a simplified flowchart regarding a fourth procedure used in the method according to one embodiment of the invention.

FIG. 12 illustrates operation of the verification module 53. During normal operation of the pointing and control device 3 (i.e., when a calibration procedure is not in progress), the verification module 53 acquires and stores series of measurements $M_I'$ of the magnetic-field vector M supplied by the magnetometer 11 (block 500). Then (block 510), the calibration solution $S_{CAL}$ is applied to the measurements $M_I'$ stored in order to determine corrected measurements $M_{IK}'$, on the basis of the equation $$M'_{IK} = \sqrt{(GM_X(M'_{XI} - OM_X))^2 + (GM_Y(M'_{YI} - OM_Y))^2 + (GM_Z(M'_{ZI} - OM_Z))^2} \quad (12)$$

The verification module 53 determines then a figure of merit $E(S_{CAL})$ for the calibration solution $S_{CAL}$ in the following way (block 520):

$$E(S_{CAL}) = \epsilon_{IK}, I = 1, 2, \ldots, N_P \quad (13)$$

where $N_P$ is the number of corrected measurements $M_{IK}'$ and $$\epsilon_{IK} = |M_{IK}' - H_E| \quad (14)$$

is the error of each corrected measurement $M_{IK}'$ with respect to the approximating value $H_E$.

The figure of merit $E(S_{CAL})$ of the calibration solution $S_{CAL}$ is then compared with a threshold figure of merit $E_T$ (block 530). If the figure of merit $E(S_{CAL})$ of the calibration solution $S_{CAL}$ is lower than the threshold figure of merit $E_T$ (block 530, output YES), the verification procedure start all over again, and a new series of measurements $M_I'$ is acquired (block 500). Otherwise (block 530, output NO), the verification module 53 decides that the calibration solution $S_{CAL}$ is not adequate for the effective value of Earth's magnetic field and generates the calibration-request signal CR for automatic activation of the calibration procedure (block 540). Alternatively, the verification module performs a different safety measurement, such as generating a warning message for the user, who decides whether to activate the calibration manually.

Finally, it is evident that modifications and variations can be made to the method and to the device described, without thereby departing from the scope of the claims.

The figure of merit could be defined in a different way, for example as the reciprocal of the figure of merit defined previously. In this case, the optimization module selects the best partial solutions associated to which is the maximum value of the figure of merit, instead of the minimum value.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
    calibrating a magnetic sensor, the calibrating including:
        acquiring measurements from the magnetic sensor during a not pre-ordered movement;
        determining, using a processor, a plurality of sets of solutions for respective expected values of intensity of Earth's magnetic field, wherein each solution is defined by a plurality of parameters including at least one gain value for each detection axis of the magnetic sensor;
        determining, using the processor, a figure of merit, correlated to a calibration error, for each solution in the sets of solutions;
        selecting, using the processor, partial solutions in the sets of solutions, respectively, based on the figure of merit;
        defining, using the processor, a gain confidence interval; and
        selecting, using a processor, a calibration solution based on the figure of merit, from among the partial solutions having respective gain values all falling within the gain confidence interval.

2. The method according to claim 1, wherein acquiring the measurements comprises:
    receiving a new measurement from the magnetic sensor;
    defining distances between the new measurement and preceding measurements; and
    deciding whether to store the new measurement based on the distances between the new measurement and the preceding measurements.

3. The method according to claim 2, wherein deciding whether to store the new measurement comprises storing the new measurement if the distances are all greater than a threshold distance and discarding the new measurement if at least one distance is smaller than the threshold distance.

4. The method according to claim 2, wherein the distance is defined by $$D_{IJ} = \sqrt{(M_{IX} - M_{JX})^2 + (M_{IY} - M_{JY})^2 + (M_{IZ} - M_{JZ})^2}$$

where $M_{IX}$, $M_{IY}$, $M_{IZ}$ are components of the new measurement corresponding to respective detection axes of the magnetic sensor and $M_{JX}$, $M_{JY}$, $M_{JZ}$ are components of the preceding measurements corresponding to respective detection axes of the magnetic sensor.

5. The method according to claim 2, wherein receiving the new measurement, defining the distances, and deciding whether to store the new measurement are repeated until a threshold number of measurements is stored.

6. The method according to claim 1, wherein determining the plurality of sets of solutions comprises:
    selecting an expected value;
    generating starting solutions, starting from the measurements acquired;
    updating a set of solutions; and
    selecting a further expected value.

7. The method according to claim 6, wherein generating the starting solutions comprises determining, for a plurality of solutions, respective first initial values of parameters that are mathematically centered around a unit value and respective second initial values of parameters that are mathematically centered around zero.

8. The method according to claim 6, wherein updating the set of solutions comprises:
    generating a new solution based on a combination of solutions of the set of solutions;
    determining a figure of merit of the new solution; and
    deciding whether to include the new solution in the set of solutions based on the figure of merit of the new solution.

9. The method according to claim 8, wherein deciding whether to include the new solution comprises:
    determining a figure of merit of a least preferred solution in the set of solutions; and comparing the figure of merit of the new solution with the figure of merit of the least preferred solution.

10. The method according to claim 9, wherein deciding whether to include the new solution further comprises including the new solution if the figure of merit of the new solution is in a pre-determined relationship with the figure of merit of the least preferred solution.

11. The method according to claim 10, wherein deciding whether to include the new solution further comprises:
if the figure of merit of the new solution is not in the pre-determined relationship with the figure of merit of the least preferred solution, defining a replacement probability as a function of the figure of merit of the new solution and of the figure of merit of the least preferred solution;
carrying out an extraction of a random variable;
including the new solution based on a first outcome of the extraction of the random variable; and
excluding the new solution based on a second outcome of the extraction of the random variable.

12. The method according to claim 1, further comprising widening the gain confidence interval, if no partial solution has respective gain values all falling within the gain confidence interval.

13. The method according to claim 1, wherein determining the figure of merit comprises:
applying a solution to the measurements for determining corrected measurements;
determining errors between each corrected measurement and an expected value; and
adding up the errors.

14. The method according to claim 1, wherein the parameters include at least one offset value for each detection axis of the magnetic sensor.

15. The method according to claim 1, further comprising:
acquiring further measurements from the magnetic sensor;
applying the calibration solution to the further measurements for determining further corrected measurements;
determining a figure of merit of the calibration solution; and
deciding whether to perform safety measurements based on a comparison between the figure of merit of the calibration solution and a threshold figure of merit.

16. A device for calibrating a magnetic sensor, comprising:
an acquisition module, configured to acquire measurements from a magnetic sensor during a non-pre-ordered movement;
an optimization module configured to:
determine a plurality of sets of solutions for respective expected values of intensity of Earth's magnetic field, wherein each solution is defined by a plurality of parameters including at least one gain value for each detection axis of the magnetic sensor;
determine a figure of merit, correlated to a calibration error, for each solution in the sets of solutions; and
select partial solutions in the sets of solutions, respectively, based on the figure of merit; and
a selection module, configured to
select a calibration solution based on the figure of merit, from among the partial solutions having respective gain values all falling within a defined gain confidence interval.

17. The device according to claim 16, wherein the acquisition module is further configured to:
receive a new measurement from the magnetic sensor;
define distances between the new measurement and preceding measurements; and
decide whether to store the new measurement based on distances between the new measurement and the preceding measurements.

18. The device according to claim 16, wherein the optimization module is further configured to:
select an expected value;
generate starting solutions, starting from the measurements acquired;
update a set of solutions; and
select a further expected value.

19. The device according to claim 18, wherein the optimization module is further configured to:
generate a new solution based on a combination of solutions of the set of solutions;
determine a figure of merit of the new solution; and
decide whether to include the new solution in the set of solutions based on the figure of merit of the new solution.

20. An electronic apparatus, comprising:
a body;
a magnetic sensor fixed to the body; and
a device for calibrating the magnetic sensor, the device including:
an acquisition module, configured to acquire measurements from the magnetic sensor during a non-pre-ordered movement;
an optimization module configured to:
determine a plurality of sets of solutions for respective expected values of intensity of Earth's magnetic field, wherein each solution is defined by a plurality of parameters including at least one gain value for each detection axis of the magnetic sensor;
determine a figure of merit, correlated to a calibration error, for each solution in the sets of solutions; and
select partial solutions in the sets of solutions, respectively, based on the figure of merit; and
a selection module, configured to
select a calibration solution based on the figure of merit, from among the partial solutions having respective gain values all falling within a defined the gain confidence interval.

21. The electronic apparatus according to claim 20, further comprising:
a control unit coupled to the magnetic sensor; and
an interface coupled to the control unit.

22. A navigation system, comprising:
a magnetic sensor configured to generate measurements indicative of a magnetic field; and
a processing unit coupled to the magnetic sensor, the processing unit operable to calibrate the magnetic sensor by:
acquiring the measurements from the magnetic sensor during movement of the magnetic sensor;
determining a plurality of sets of solutions for respective expected values of intensity of Earth's magnetic field, wherein each solution is defined by a plurality of parameters including at least one gain value for each detection axis of the magnetic sensor;
determining a figure of merit, correlated to a calibration error, for each solution in the sets of solutions;
selecting partial solutions in the sets of solutions, respectively, based on the figure of merit;
selecting a calibration solution based on the figure of merit, from among the partial solutions having respective gain values all falling within a defined gain confidence interval.

23. The navigation system according to claim 22, wherein the processing unit is further operable to:
receive a new measurement from the magnetic sensor;
define distances between the new measurement and preceding measurements; and
decide whether to store the new measurement based on the distances between the new measurement and the preceding measurements.

24. The navigation system according to claim 22, wherein the processing unit is further operable to:
select an expected value;
generate starting solutions, starting from the measurements acquired;
update a set of solutions; and
select a further expected value.

25. The navigation system according to claim 24, wherein the processing unit is further operable to:
generate a new solution based on a combination of solutions of the set of solutions;
determine a figure of merit of the new solution; and
decide whether to include the new solution in the set of solutions based on the figure of merit of the new solution.

26. A method of calibrating a magnetic sensor, comprising:
sampling a magnetic field a plurality of times with a magnetic sensor during a not pre-ordered movement, wherein the magnetic sensor has a plurality of detection axes;
for each of a plurality of expected values of intensity of Earth's magnetic field, calculating, using a processor, a plurality of sets of presumptive calibration solutions based at least on the plurality of samples of the magnetic field, wherein each set of presumptive calibration solutions is comprised of multiple presumptive calibration solutions, and where each respective presumptive calibration solution is defined by a respective plurality of parameters including a respective gain value for each one of the plurality of detection axes;
for each set of presumptive calibration solutions of the plurality of sets of presumptive calibration solutions, calculating, using the processor, a respective figure of merit, which is correlated to a respective calibration error, for at least one presumptive calibration solution of the respective set of presumptive calibration solutions;
selecting, using the processor, a plurality of partial calibration solutions from the plurality of sets of presumptive calibration solutions based at least on the calculated figures of merit; and
selecting, using the processor, a final calibration solution from the plurality of partial calibration solutions based at least on respective gain values for the selected final calibration solution, wherein each respective gain value of the selected final calibration solution falls within a gain confidence interval.

27. The method according to claim 26, wherein sampling a magnetic field a plurality of times with a magnetic sensor during a not pre-ordered movement comprises:
receiving a current sample of the magnetic field at a current location of the magnetic sensor;
calculating distances between the current location of the magnetic sensor and preceding locations of the magnetic sensor at which the magnetic sensor previously sampled the magnetic field; and
selectively storing the current sample of the magnetic field based at least on each of the calculated distances being greater than a minimum distance.

28. The method according to claim 27, wherein a respective distance between the current location of the magnetic sensor a respective preceding location of the magnetic sensor is defined by $$D_{IJ} = \sqrt{(M_{IX} - M_{JX})^2 + (M_{IY} - M_{JY})^2 + (M_{IZ} - M_{JZ})^2}$$

where $M_{IX}$, $M_{IY}$, $M_{IZ}$ are components of the current sample of the magnetic field corresponding to respective detection axes of the magnetic sensor and $M_{JX}$, $M_{JY}$, $M_{JZ}$ are components of a respective preceding sample corresponding to respective detection axes of the magnetic sensor at the respective preceding location.

29. The method according to claim 26, wherein for each of a plurality of expected values of intensity of Earth's magnetic field, calculating a plurality of sets of presumptive calibration solutions comprises:
selecting at least a first respective presumptive calibration solution and a second respective presumptive calibration solution from a respective set of presumptive calibration solutions;
associating a first respective gain value for the first respective presumptive calibration solution with a first detection axis of the plurality of detection axes of the magnetic sensor;
associating a second respective gain value for the second respective presumptive calibration solution with a second detection axis of the plurality of detection axes of the magnetic sensor; and
calculating a third respective presumptive calibration solution based at least on the first and the second respective gain values.

30. The method of claim 26 wherein the respective plurality of parameters that define a respective presumptive calibration solution further include a respective offset value for each one of the plurality of detection axes.

31. The according to claim 30, comprising:
for each respective set of calibrations solutions, calculating a respective initial set of offset values for at least one calibration solution of the respective set of calibration based at least on a random number.

32. The according to claim 31, comprising:
for each respective set of calibrations solutions, calculating a respective initial set of offset values for at least one calibration solution of the respective set of calibration based at least on a random number.

* * * * *